United States Patent
McGinley et al.

(10) Patent No.: US 9,269,484 B2
(45) Date of Patent: Feb. 23, 2016

(54) MAGNET ASSEMBLY

(71) Applicant: Emscan Limited, Kent (GB)

(72) Inventors: John Vincent Mario McGinley, London (GB); Mihailo Ristic, London (GB); Colin Bowden Besant, Buckinghamshire (GB); Ian Robert Young, Wiltshire (GB)

(73) Assignee: Emscan Limited (GB)

( * ) Notice: Subject to any disclaimer, the term of this patent is extended or adjusted under 35 U.S.C. 154(b) by 115 days.

(21) Appl. No.: 14/250,078

(22) Filed: Apr. 10, 2014

(65) Prior Publication Data

US 2014/0218145 A1 Aug. 7, 2014

Related U.S. Application Data

(62) Division of application No. 12/670,781, filed as application No. PCT/GB2008/002496 on Jul. 22, 2008, now abandoned.

(30) Foreign Application Priority Data

Jul. 26, 2007 (GB) .................................. 0714600.4
Jun. 10, 2008 (GB) .................................. 0810607.2

(51) Int. Cl.
*H01F 7/06* (2006.01)
*G01R 33/383* (2006.01)
*H01F 3/10* (2006.01)
*H01F 6/04* (2006.01)

(52) U.S. Cl.
CPC ................ *H01F 7/06* (2013.01); *G01R 33/383* (2013.01); *H01F 3/10* (2013.01); *H01F 6/04* (2013.01)

(58) Field of Classification Search
CPC ........... G01R 33/383; H01F 7/06; H01F 3/10; H01F 6/04
USPC ........... 335/284, 296–301, 216; 324/318, 300
See application file for complete search history.

(56) References Cited

U.S. PATENT DOCUMENTS 4,445,102 A 4/1984 Thorn et al.
4,506,240 A 3/1985 Shores et al.
(Continued)

FOREIGN PATENT DOCUMENTS

EP 0645641 A1 3/1995
EP 0785442 A1 7/1997
(Continued)

OTHER PUBLICATIONS

"Related U.S. Appl. No. 12/670,781", "Office Action", Apr. 24, 2013, Publisher: USPTO, Published in: US.
(Continued)

*Primary Examiner* — Mohamad Musleh
(74) *Attorney, Agent, or Firm* — Kaplan Breyer Schwarz & Ottesen, LLP (57) ABSTRACT

An electromagnet comprising a ferromagnetic yoke which comprises a yoke. Mutually opposing first and second pole pieces are provided. The first pole piece is provided with a planar coil having a first side facing the yoke and a second side facing the yoke. A balancing member is arranged on the second side of the planar coil to counterbalance the attractive force between the planar coil and the yoke. The other pole piece may also be provided with a corresponding balancing member.

38 Claims, 8 Drawing Sheets

(56) References Cited

U.S. PATENT DOCUMENTS

| | | |
|---|---|---|
| 4,672,346 A | 6/1987 | Miyamoto et al. |
| 4,766,378 A | 8/1988 | Danby et al. |
| 4,870,380 A | 9/1989 | McGinley |
| 5,250,901 A | 10/1993 | Kaufman et al. |
| 5,448,213 A | 9/1995 | Kalsi |
| 5,982,260 A | 11/1999 | Byrne |
| 6,335,670 B1 | 1/2002 | Kinanen |
| 7,071,694 B1 | 7/2006 | Kruip |
| 7,242,191 B2 | 7/2007 | Laskaris et al. |
| 2002/0097122 A1 | 7/2002 | Rapoport |
| 2003/0048163 A1 | 3/2003 | Watanabe et al. |
| 2004/0100261 A1 | 5/2004 | Laskaris et al. |
| 2007/0170921 A1 | 7/2007 | Aoki et al. |

FOREIGN PATENT DOCUMENTS

| | | |
|---|---|---|
| WO | 8804057 A1 | 6/1988 |
| WO | 9407250 A1 | 3/1994 |

OTHER PUBLICATIONS

"Related U.S. Appl. No. 12/670,781", "Final Office Action", Oct. 10, 2013, Publisher: USPTO, Published in: US.

"Related U.S. Appl. No. 12/670,781", "Office Action—Restriction Requirement", Dec. 10, 2012, Publisher: USPTO, Published in: US.

"International Patent Application No. PCT/GB2008/002496", "International Search Report & Written Opinion", Oct. 9, 2008, Publisher: PCT, Published in: GB.

MAGNET ASSEMBLY

FIELD OF THE INVENTION

The present invention relates to an assembly for an electromagnet, particularly an electromagnet of the kind intended for producing a very high intensity magnetic field such as may be used in a magnetic resonance imaging (MRI) system. However, it is also applicable to other high field applications such as nuclear magnetic resonance spectrometry (NMR), electron spin resonance spectroscopy (ESR) or general physics laboratory research.

BACKGROUND OF THE INVENTION

Traditionally, MRI machines are large expensive devices which have to be located in a specially constructed or adapted MRI room and require the operator to have a high degree of skill. These aspects preclude the use of MRI as a diagnostic tool in applications where space is at a premium and where it would be desirable for the machine to be operated by, for example, nursing staff with only a limited degree of training. An example of such an application would be in an accident and emergency (A & E) unit.

To meet the aforementioned requirements, a magnet design should ideally have one or more of the following attributes:

Open, to facilitate patient handling and to minimise the risk of patient claustrophobia;
Compact and light, for ease of installation;
Small fringe field, to minimise the need for magnetic shielding of the room;
Low power consumption thus, low cryocooler power supply requirements;
Low cost; and
Suitable for stand-by use, allowing rapid field ramp-up and ramp-down.

An impediment to such a design is the strong attractive force between the primary field coils and the magnet yoke which may severely limit the achievable performance and practicality of the magnet design.

The present invention addresses a solution to this problem by provision of a counterbalancing member which extends beyond the plane of a coil. It is known for pole pieces in MRI machines to be formed with a "lip" which extends over the outer surface of the coils, such as disclosed in GB-A-2 282 451 but conventionally, this lip is not fabricated or configured so as to counterbalance the aforementioned forces.

DEFINITION OF THE INVENTION

The present invention is aimed at provision of a compact, open and low-cost magnet for a magnetic resonance imaging (MRI) system. The magnet can offer a substantial imaging field of typically around 0.5 Tesla at moderate weight and fringe field which would facilitate its location in a wide range of environments.

In the broadest aspect, the present invention provides an electromagnet comprising a yoke and a pair of mutually facing pole pieces, one or both of which is provided with a respective coil, the coil or coils being provided with a respective balancing member which at least partially counterbalances the attractive force between the coil or coils and the yoke. Generally speaking, the or each balancing member may be considered to be positioned closest to a side of the relevant coil which is opposite to that side of the coil closest to the part of the yoke which carries the associated pole piece. Thus, along the axis of a coil, the coil may be considered to be situated between that part of the yoke which supports the associated pole piece and the balancing member (or a radial plane through the balancing member, substantially parallel to the coil axis). At least part of balancing member or members may, for example, have a higher magnetic permeability and/or a higher saturation magnetisation value than the yoke or, at least, than that part of the yoke carrying the associate pole piece(s).

Thus, a first aspect of the present invention now provides an electromagnet comprising a ferromagnetic yoke which comprises first and second arms linked by a spine, wherein the first and second arms are provided respectively with mutually opposing first and second pole pieces, the first pole piece being provided with a planar coil having a first side facing the first arm and a second side facing the second arm, a ferromagnetic balancing member being arranged on the second side of the planar coil to counterbalance the attractive force between the planar coil and the first arm.

A second aspect of the present invention provides an electromagnet comprising a ferromagnetic yoke which comprises first and second arms linked by a spine, wherein the first and second arms are provided with mutually opposing first and second pole pieces, the first pole piece being provided with a planar coil having a first side facing the first arm and a second side facing the second arm, a ferromagnetic balancing member being arranged on the second side of the planar coil, at least part of the balancing member having a higher magnetic permeability than that of the first arm and/or at least part of the balancing member having a higher saturation magnetisation than that of the first arm.

A third aspect of the present invention provides an electromagnet comprising a ferromagnetic yoke which comprises first and second arms linked by a spine, wherein the first and second arms are provided with mutually opposing first and second pole pieces, the first pole piece being provided with a planar coil having a first side facing the first arm and a second side facing the second arm, a ferromagnetic balancing member being arranged on the second side of the planar coil, wherein the ferromagnetic balancing member is non-ferromagnetically separated from the first pole piece and the first arm.

In respect of the third aspect of the present invention, the ferromagnetic balancing member is preferably non-ferromagnetically separated from the entire yoke and when present, so is the further ferromagnetic balancing member. Non-ferromagnetic separation of one member from another means that the two members are not physically connected by ferromagnetic material, e.g. by virtue of being separated by an air gap or being joined by a material which is not ferromagnetic.

In one class of embodiments, the second pole piece which is associated with the second arm is not provided with a corresponding coil but is configured such that between the pole pieces, a substantially homogeneous magnetic field is generated in a subject examination region when the planar coil associated with the first pole piece is energised.

In another class of embodiments, the second pole piece which is associated with the second arm is also provided with a further planar coil having a first side facing the second arm and a second side facing the first, a further balancing member being arranged on the second side of the further planer coil to counterbalance the attractive force between the further planar coil and the second arm, e.g. (i) the further balancing member having a higher magnetic permeability than that of the second arm and/or at least part of the further balancing member having a higher saturation magnetism than that of the second arm; and/or (ii) the further ferromagnetic balancing member being non-ferromagnetically separated from the second pole piece and the second arm.

A magnet assembly according to a fourth aspect of the present invention provides an electromagnet comprising a ferromagnetic yoke supporting at least one pair of mutually facing planar coils, each coil in said at least one pair having a first side facing the yoke and a second side facing the other coil, wherein a respective ferromagnetic balancing member is arranged on the second side of each coil to counterbalance the attractive force between the coil and the yoke.

Any electromagnet or electromagnet assembly according to any single aspect of the present invention may incorporate any one or more essential, preferred or specifically described features of any electromagnet or electromagnet assembly according to any one or more of the other aspects of the invention. The present invention also extends to a machine, in particular an MRI, NMR or ESR machine comprising an electromagnet or electromagnet assembly according to the invention. These machines may also comprise the requisite r.f. coils (transmitter and receiver coils) or the r.f. coils may he part of a free-standing separate unit. An MRI machine will normally also include gradient coils. As used herein, the term MRI includes fMRI (functional magnetic resonance imaging).

DETAILED DESCRIPTION OF THE INVENTION

Depending on the particular aspect of the invention, it is preferable, or essential as the case may be, for at least part of any or each balancing member to have a higher magnetic permeability than that of its associated yoke arm and/or for at least part of the balancing member to have a higher saturation magnetisation than that of the relevant arm. Typically, the yoke may be made of low carbon steel, preferably with the pole regions being laminated, the balancing member to be composed of steel with a significant cobalt and/or nickel content.

The electromagnetic assembly according to any of the first to third aspects of the present invention employs at least one pair of pole pieces. Some embodiments may comprise a second pair of pole pieces, e.g. with an axis of symmetry orthogonal to that of the first pair pole pieces. The second and any further pairs of pole pieces need not have the same geometry as the first pair of pole pieces, or of each other and need not conform to the definition of the present invention, although preferably they will also meet this definition.

The electromagnetic assembly according to the fourth aspect of the present invention employs at least one pair of planar coils. Some embodiments may comprise a second pair of planar coils, e.g. with an axis of symmetry orthogonal to that of the first pair of coils. The second and any further pairs of coils need not have the same geometry as the first pair of coils, or of each other and need not conform to the definition of the present invention, although preferably they will also meet this definition.

By 'planar' coils is meant coils which are generally annular and although having a finite thickness (height), the windings generally lie within a single plane, as opposed to having the structure of an elongate (cylindrical) winding such as used in a solenoid coil. Thus, considering the plane through the maximum circumference of the annulus, such a coil can be considered to have two sides.

Thus, preferably the coil or coils for producing the main field, i.e. the coils associated with the pole pieces is, or are, planar, or rather "substantially planar". Obviously, any such coil has a finite thickness. A "solenoidal coil" can recognised as having a diameter:height ratio of 1:1 or less, e.g. 1:2 or less. A planar coil would normally be recognised as having a diameter:height ratio of more than 1:1, e.g. at least 2:1. In the case of the present invention, preferred planar coils have a diameter:height ratio of at least 5:1, more preferably at least 10:1 and still more preferably at least 15:1. In practice, the diameter:height ratio is unlikely to exceed 50:1 and preferably, in order to ensure that sufficient turns can be incorporated in the windings, that ratio would not normally exceed 25:1.

The coil or coils are mounted on a yoke, substantially facing each other. Therefore, preferably, the yoke is H-shaped or C-shaped although to enable access of a subject in a range of orientations, C-shaped is much preferred, "C-shaped" includes a curved 'C' configuration as well as a yoke configuration which resembles three sides of a square or rectangle (i.e. a substantially straight spine with respective substantially straight arms extending substantially parallel to each other from either end of the spine. However, even in the case of a continuously curved C-shaped configuration, the yoke may be considered to comprise two curved arms joined by a curved spine contiguous therewith. Generally speaking, the pole pieces extend and face inwardly, extending towards each other from the ends of the arms.

The balancing member for any or each coil functions to counterbalance, preferably to substantially totally counterbalance, the attractive force between the coil and the yoke. To assist this, a number of approaches may be employed, either singly or in combination.

Thus, depending on the particular embodiment, the electromagnet o the present invention may provide one or more of the following advantageous constructional features:

An open magnet involving a yoke (C or H shaped) to offer naturally low fringe field;
Compact design derived from smaller diameter coils and poles, made possible by the complexity of design of the pole pieces;
Balanced forces on the main coils resulting in reduced load bearing requirements for the cold mass support;
A single cryostat, even in the case where two coils are used;
A low thermal load (in combination with a cryostat) owing to the reduced cross section of cold mass support and hence, reduced head load;
Reduced peak power owing to unshielded gradients, can be made possible by the use of powder metal in critical areas of the pole pieces (to reduce eddy currents in the pole pieces due to rapidly switching gradient coils).

In one approach, it is preferred for any or each coil to be situated closer to its associated balancing member than to the yoke. It is also preferred for any or each balancing member to have a higher magnetic permeability than that of the yoke. This means that given the high flux generated by a coil suitable for use in applications such as in an MRI machine, if the coil is sufficiently close to the balancing member, it can achieve a higher degree of magnetisation than the yoke, before saturation, bearing in mind the need for the balancing member to have smaller mass/dimensions than the body of the yoke. For similar reasons, it is also preferable for at least part of any or each balancing member to have a higher magnetic permeability than that of the yoke.

The balancing member may, for example, be in the form of one or more independently supported ferromagnetic rings. However, in a preferred class of embodiments, any or each balancing member is preferably constituted by part of a respective pole piece, i.e. integral therewith. The pole pieces are ferromagnetic members extending towards each other from the yoke in the vicinity of, preferably passing through the coils. A particularly preferred configuration is wherein any or each pole piece is generally annular when viewed axially, although as will be explained in more detail hereinbelow, the outer circumferential surface and/or inner surface of the annulus may be provided with one or more projections and/or indentations and/or irregularities, preferably continuously around the annulus of the pole piece and/or in the yoke in the vicinity of the pole piece, to provide advantageous properties, in particular with regard to the functioning of the balancing member. Provision of shims to fine-line the magnetic field is also advantageous, e.g. to compensate for lack of axial symmetry in the yoke.

A pole piece may be constructed as a composite, for example, comprising two or more constituent members made from different materials, e.g. two or more generally annular shaped pieces which may be joined by any suitable means such as bolting. One or more of these individual members may constitute the balancing member and therefore, may be formed of material(s) having a higher magnetic permeability and/or higher saturation than the yoke. In general, substantially each constituent member of the composite may play a role in balancing the force. Members having a higher permeability will contribute more than those having a relatively lower permeability, One or more of the constituent members are preferably generally annular and most preferably, have a substantially square or substantially rectangular profile when viewed in axial cross-section. It is especially preferred for one or more of the corners of the substantially square or substantially rectangular profile to be chamfered, preferably on a corner facing the relevant coil. The constituent members may be of such a configuration that each pole piece has azimuthally-varying non-uniform height for correcting components of field inhomogeneity which are not axially symmetric.

The pole pieces may be constructed with one or more other advantageous features to ensure substantial homogeneity of the generated field. For example, one or more ferromagnetic or permanent magnet field-tuning rings may be provided, preferably situated inside the inner radial profile of each pole piece. In addition, where a pole piece comprises a plurality of substantially annular constituent members made of different materials, these may have non-uniform height (thickness) around the circumference to correct fields in homogeneity in at least one direction, for example in a linear direction substantially perpendicular to side supporting member(s) in a C-shaped or H-shaped yoke, which will generate non-axially symmetric components of magnetic field.

For MRI or similar high field applications, any or each coil is preferably superconducting coils provided with a suitable cooling means. Particularly preferred are coils made from one or more high temperature superconducting materials. By 'high temperature superconducting material' is meant a material which demonstrates superconductivity at a temperature above 20° K. Alternatively, 'high temperature superconducting material' may also be interpreted to mean a material with a superconducting working temperature operating as a magnet of above 10° K. That is because for many of these materials, the onset of superconductivity in the characteristic curve of the superconductor is not very sharp. Therefore, lower temperatures than the highest at which superconductivity is first demonstrated are preferred for better performance. A particularly preferred high temperature superconductor is magnesium diboride ($MgB_2$) or $MgB_2$ doped with another suitable material such as silicon carbide, hosted in a matrix of copper. Other suitable high temperature superconductors include niobium nitride, niobium carbide, niobium boride and molybdenum diboride, although these materials require lower temperatures than $MgB_2$. Yet other high temperatures superconductors which could be used include NbTi. NbSb, bismuth strontium calcium copper oxide (BSCCO) and yttrium barium copper oxide (YBCO) which have a higher critical temperature but are generally less suited to high current density and long wire applications, as well as being more expensive.

When a plurality of superconducting coils is mounted on a generally C-shaped yoke, they would normally be fixed to a respective arm member which is joined by a support member and can share a common cryo-cooling system.

BRIEF DESCRIPTION OF THE DRAWINGS

The present invention will now be explained in more detail by way of the following description of preferred embodiments and with reference to the accompanying drawings in which.

DESCRIPTION OF THE PREFERRED EMBODIMENTS

Figure 1:
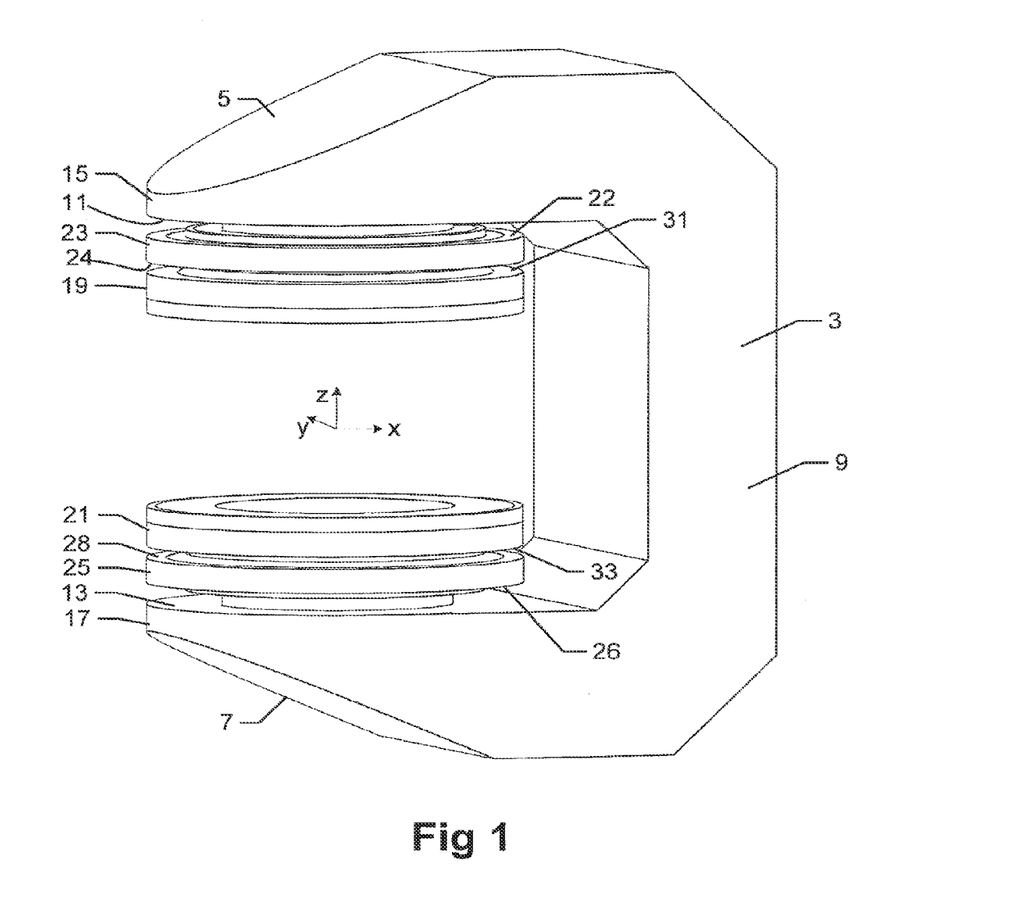
FIG. 1 shows a three dimensional view of a first embodiment of the overall structure of a magnet assembly according to the present invention.

Referring now to FIG. 1, a magnet assembly 1 comprises a C-shaped steel yoke 3. The yoke itself comprises an upper arm 5, and a lower arm 7 linked by a spine 9. Mounted on the inside surfaces 11, 13 of the free ends 15, 17 of the arms 5, 7, respectively, are upper and lower pole pieces 19, 21, surrounded by respective planar annular drive coils 23, 25. In use, the coils drive magnetic flux around the yoke to produce a substantially uniform magnetic field in the central region between the poles.

The drive coil 23 has a first side 22 facing the upper yoke arm 5 and a second side 24 facing the other coil 25. Similarly, the drive coil 25 has a first side 26 facing the lower yoke arm 7 and a second side 28 facing the other coil 23.

Figure 2:
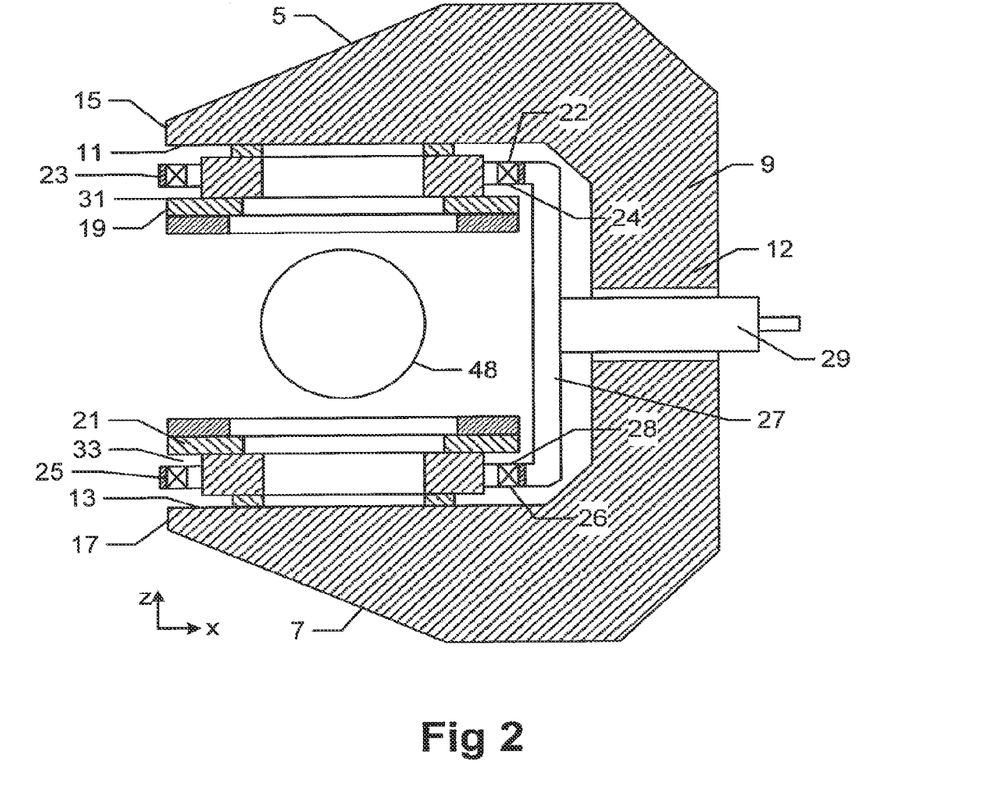
FIG. 2 shows a more detailed two dimensional cross-section in the x-z plane of the assembly shown in FIG. 1.
Figure 3:
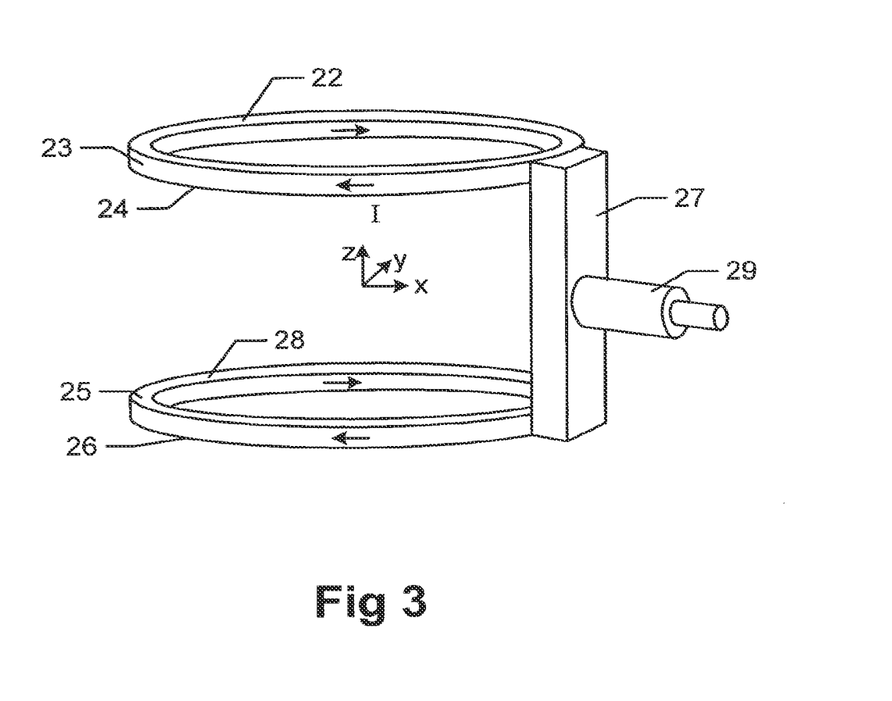
FIG. 3 shows how the coils in the assembly of FIGS. 1 and 2 are joined by a supporting member.

Referring to FIGS. 2 and 3, the pair of drive coils 23, 25 carry equal currents current i in the same sense and in series with one another. The coil formers are joined by mechanical supporting member 27 to one side of the coil in the +x direction. The coils 23, 25 and supporting member 27 are enclosed in a single cryostat assembly (not shown) which is needed to cool the coils to superconducting temperatures. This single-sided supporting member is needed to provide free access to the imaging region of the magnet assembly 1 from three sides. The supporting member 27 is on the same side x of the magnet as the spine 9 of the yoke 3. Attached to the supporting member 27 at the midpoint thereof is a cold head 29 of a cryocooler system which provided the cooling required for both coils through thermal conduction along the support. The cryocooler can most conveniently be fed through a hole in the centre of the spine 9 of the yoke 3, preventing any interference to access on the open three sides.

In a conventional C-coil magnet the axial Lorentz magnetic forces acting on a coil can be of the order of many tonnes. If this were the case, then a single-sided support would not be practicable since the moment of the forces would be too great for such a support to bear.

However the yoke and pole design of this embodiment are such that the axial forces on the coils are substantially balanced. The coils 23, 25 are recessed into respective annular recesses 31, 33 in the side of the pole pieces 19, 21 so that the magnetic pull of the coils 23, 25 onto the yoke 3 is counterbalanced by the force of the coils 23, 25 onto the pole pieces 19, 21. Therefore, this single-sided support system essentially needs to bear only the weight of the coils and their respective formers, which need not he excessive. There is a moderate static load on the force in the x direction owing to the lack of axial symmetry of the yoke 3.

Any remaining unbalanced axial component of the force on each coil is absorbed as a tension in the support member 27.

Figure 4:
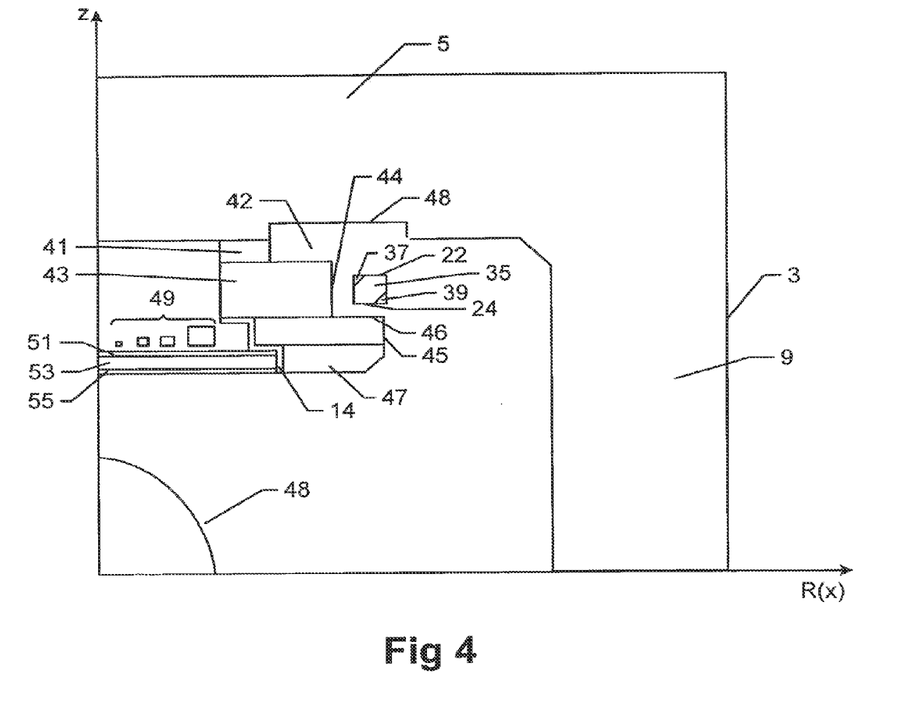
FIG. 4 shows the first quadrant of the central region of the assembly of FIGS. 1 3, showing further details.

The net force on the combined coil system thus comprises the combination of weight and static x load which can be made a fraction of one tonne. This means that the supports for the coils 23, 25 may be made relatively light which in turn reduces the thermal load into the system and hence the power needed for the cryocooler. FIG. 4 shows a cross section of the central radial region of the magnet assembly 1 in one quadrant. There is mirror symmetry about the z=0 axis. There is also rotational symmetry about the r (radial) axis apart from the vertical portion of the yoke 3 which is included for reference.

The winding cross section of the upper coil 23 is shown as 35. Such a winding tends to produce regions of high magnetic flux density and stress at opposite corners of the winding cross-section. Chamfers 37, 39 in the shape of the winding 35 may be included in the design to eliminate such hot spots and help keep the winding in conditions of magnetic field stress below their critical levels and favourable for superconductivity.

The magnet winding 35 is formed of High Temperature Superconductor (HTSC) wire fabricated from magnesium diboride ($MgB_2$). For operating fields between 0.5 T and 1 T. $MgB_2$ has been proved to usable in these conditions. The advantage is that the operating temperature can be in the region of 20K rather than the 4.2 K required for conventional superconductors. This makes conductive cooling by a single cryocooler possible and at a relatively low cooling power.

The top arm 5 the yoke 3 is joined to the support member 9 on the +x side only.

The pole assembly comprises a set of concentric rings 41, 43, 45, 47 (four are shown here for example but this number could vary) the purpose of which is to provide a varying inner and outer radial profile for the pole. The outer radial profile is dominant in determining the force balance in the coil, in particular the outer diameters of rings 41 and 43. The coil is positioned such that its inner radius is significantly less than the outer radius of ring 45, thereby creating an annular recess for the coil 23. As the coil 23 must be positioned close to the outer radius 44 of ring 43 and the outermost surface 46 of ring 45, one alternative form of construction may be to incorporate these surfaces into the composition of the room-temperature walls of the coil cryostat.

A second feature of the outer radial profile of the pole which helps balance the force is the recess 42, formed by the radial step between the outer radii, between members 41 and 43 of the pole assembly.

A third feature which helps to balance the force is the recess 48 in the inside surface 11 of the upper arm 5 of the yoke 3, extending from the inner radial surface of concentric ring 41 to just beyond the coil 23. This helps to reduce the outer axial force on the coil.

A combination of two or all three of these measures may be combined to achieve an optimal force balance.

The material of the rings may vary as is required to carry the required flux. In particular rings 43 and 45 may be made of a material of higher magnetic saturation such as a steel of high-cobalt content.

The lower rings 43, 45, 47 constitute a 'balancing member' of the pole piece. In the context of the present invention, it may be understood that this arrangement is situated closer to the second side 24 of the coil 23 than the first side 22 of the coil 23 is to the upper arm 5 of the yoke 3.

The inner radii of the pole piece rings 41, 43, 45, 47 are designed mainly to shape the magnetic field for optimal homogeneity. As well as the pole piece rings having the vertical inner walls shown, they may also contain chamfers, tapers or more general curved surfaces to this end. This includes the inner-facing wall of the yoke top inside the ring 41. Ring 45 indicates a recess with respect to ring 43 to allow additional space for the presence of shim rings. The four or more shim rings 49 provide a means of fine tuning the systematic magnet homogeneity design in combination with the pole ring geometries.

The shim rings 49 may comprise a combination of high permeability steel or permanently magnetized material such as neodymium iron boron in a general orientation of magnetization including that opposite to the main field or in a radial direction. It should be noted that the entire hollow space inside the pole rings 41, 43, 45, 47 is available for shim rings as required although they will tend to be more powerful nearer the imaging volume as shown. The net result of the field optimization is a region of high homogeneity suitable for MRI imaging inside the spherical shell indicated by 48. For some applications of magnet however it may be advantageous to optimize the homogeneity toward an oblate or prolate spheroid instead of the sphere.

The asymmetry of the magnet due to the presence of the yoke 3 will produce a transverse (i.e. non-axially symmetric) variation in field. To compensate for this, a set of azimuthal variations is required to compensate for which there are several measures which can be combined. These include tilt of the poles, selective cutaways or chokes in the interfacing surfaces between the interfaces between pole piece members 41, 43, 45, 47 and the inner surface 11 of the upper yoke arm 5. Further sculpting of the cross section of the support member 9 can also be employed.

The inner radius of the rose ring 47 is further recessed with respect to ring 43 to accommodate three further assemblies namely the shimset 51, the gradient set 53 and the rf transmit coil 55. The order of shimset 51 and gradient set 53 in the stack is reversible in principle.

The shimset 51 comprises an array of passive steel or permanent magnet dipoles which may be adjusted to compensate for non-systematic variations in magnet homogeneity such as manufacturing tolerances or the magnetic environment of the room. The shims are adjusted according to a field map in the target homogeneous volume 48.

The gradient set may be an actively shielded or non-actively shielded set. Should the non-actively shielded option be chosen for maximum efficiency, the inward facing surfaces 14 of the pole assembly 41, 43, 45, 47 may optionally be formed of high-permeability powdered or laminated iron.

The effect of this arrangement is to carry gradient coil flux whilst inhibiting eddy current flow when current levels in the gradient coils are switched.

FIGS. 5A through 5G show different basic geometries of pole piece with integral balancing member, to better explain the most important features of, and some possible variations in the embodiment shown in FIG. 4. In FIGS. 5A-5G, reference numeral 5 denotes the upper arm of the yoke as depicted in FIG. 4. Reference numeral 61 shows an integral pole piece/balancing member as referred to in the previous figures, which may be of composite form and with relevant chamfers but for convenience, these are not depicted here. Reference numeral 23 depicts the coil.

Figure 5A:
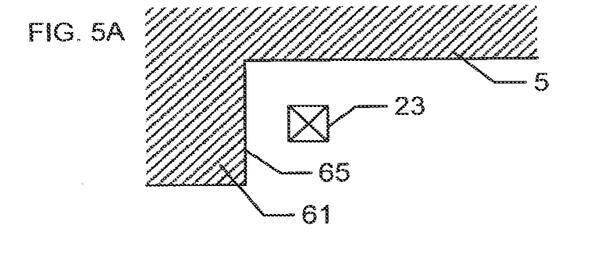
FIGS. 5A through 5G show some basic alternative pole piece balancing member geometries.

In FIG. 5A, numeral 61 depicts a conventional pole piece without any configuration to act as a balancing member and is therefore conventional, and not in accordance with the present invention.

Figure 5B:
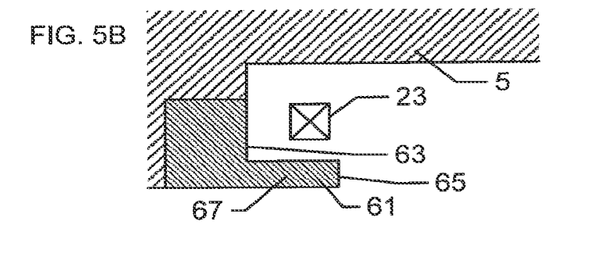

The geometry shown in FIG. 5B is like that in FIG. 5A, but a recess 63 is formed in the side wall 65 of the pole piece, thereby providing a laterally extending portion 67 to act as a balancing member. The portion denoted 67 is made from cobalt steel whereas the upper arm 5 of the yoke is made from laminated carbon steel.

Figure 5C:
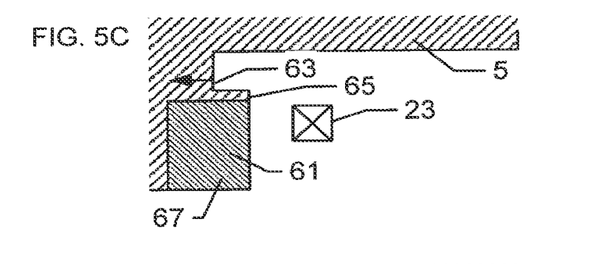

The configuration in FIG. 5C is the same as that in FIG. 5B, except the coil 23 is situated to one side of the laterally extending balancing member 67 which is of greater thickness than that depicted in FIG. 5B.

Figure 5D:
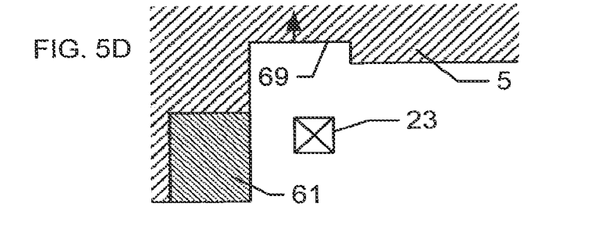

In FIG. 5D, it can be seen that there is a recess 69 in the upper arm 5 of the yoke.

Figure 5E:
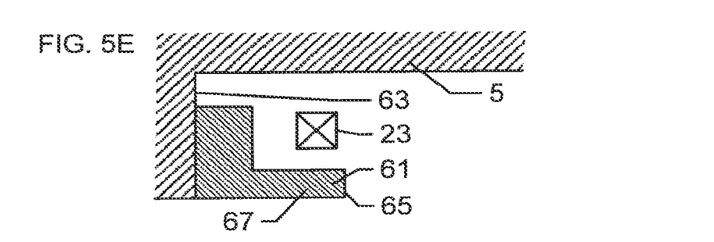
Figure 5F:
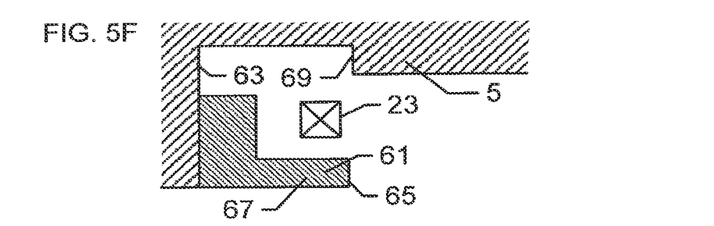
Figure 5G:
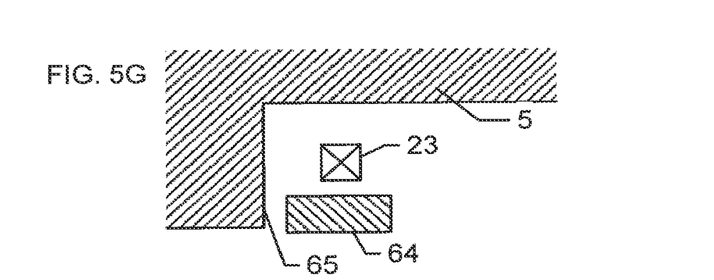

The configuration in FIG. 5E can be seen to combine the arrangements of FIGS. 5B and 5C and the configuration of FIG. 5F combines the configurations of all of FIGS. 5B, 5C and 5D. FIG. 5G shows the situation where there is an annular counterbalancing member 64 not attached to the side wall 65. FIG. 5C is an example of non-ferromagnetic separation.

Figure 6:
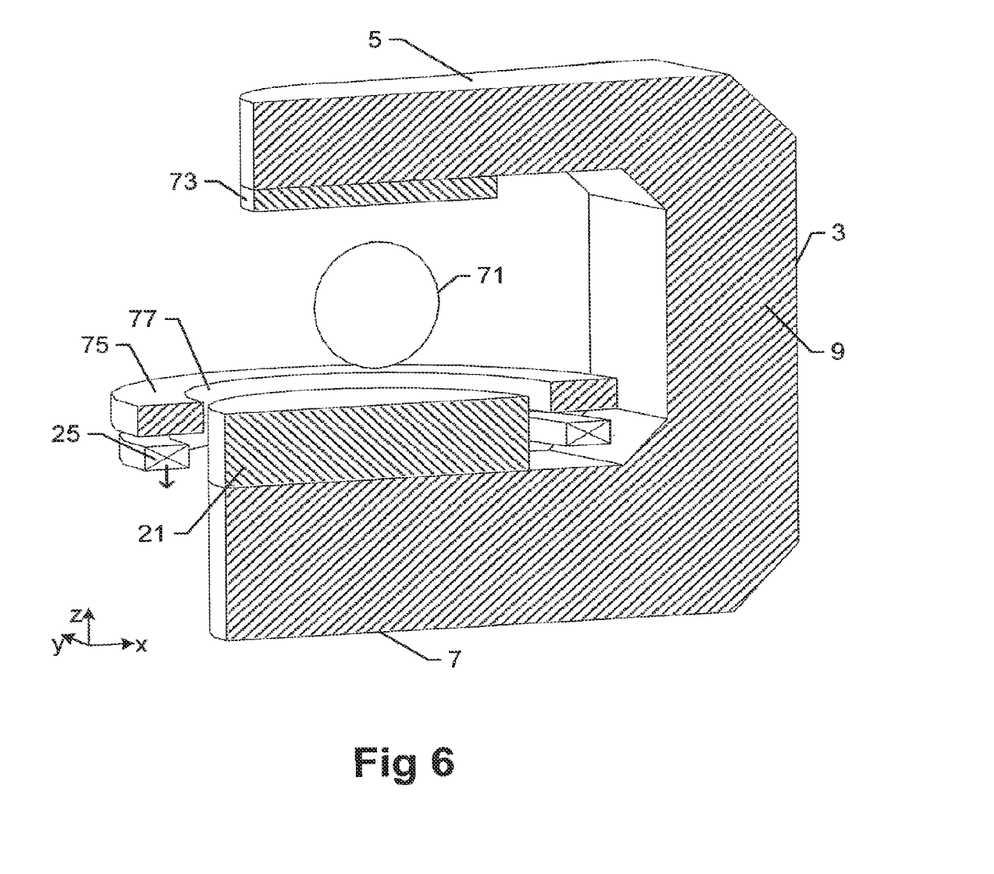
FIG. 6 shows a three-dimensional cross-section through a second embodiment of the present invention and FIG. 7 shows a partial two dimensional cross-section through the embodiment of FIG. 6, showing the lines of magnetic flux.

FIG. 6 shows a second embodiment of an electromagnetic assembly of an MRI machine in accordance with a second embodiment of the present invention.

Reference numeral 71 is a circle depicting a notional patient or subject examination area. In this Figure, reference numerals which are the same as those used in FIGS. 1-5 denote integers which are the same as in those latter Figures.

One difference between this second embodiment and the first embodiment is that there is only one coil, namely the lower coil 25 surrounding the lower pole piece 21. An upper pole piece 73 is not provided with a coil and is dimensioned so as to have a smaller radial cross-sectional diameter than that of the lower pole piece 21. In addition, a 'floating' balancing member 75 is separated by an air gap 77 from the lower pole piece 71.

Figure 7:
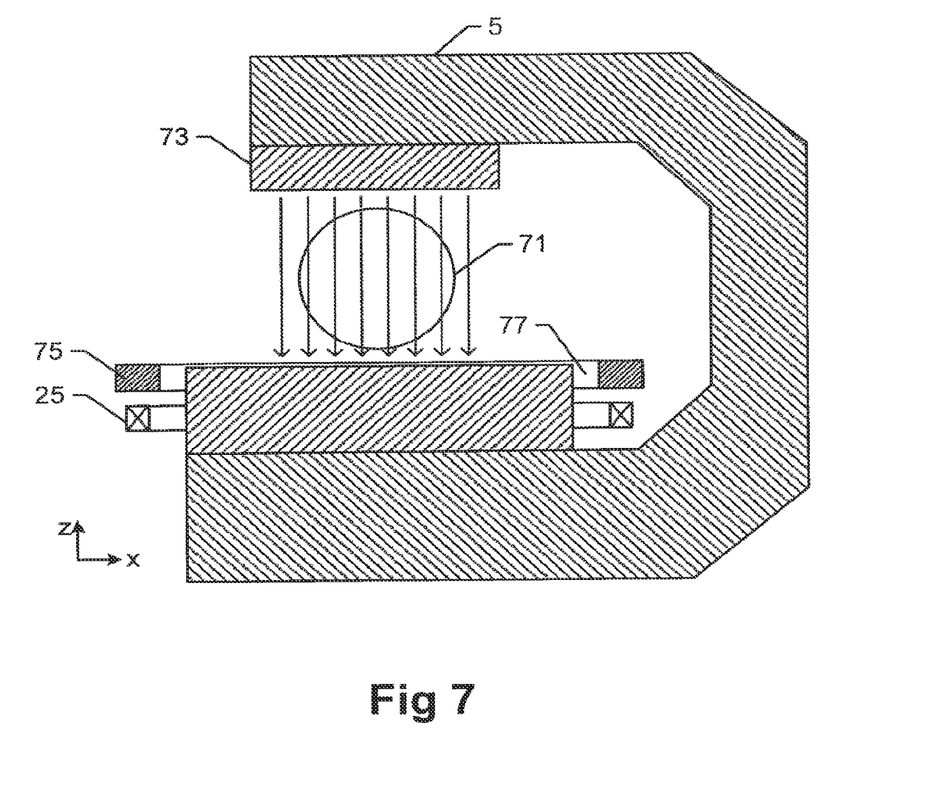

FIG. 7 shows a partial two-dimensional cross-section through the view of FIG. 6, in which the feint lines show the lines of magnetic flux. It can be seen that through the patient or subject examination region 71, these are substantially homogeneous.

In the light of the described embodiments, modifications of those embodiments, as well as other embodiments, for example as defined by any one or more of the appended claims, will now become apparent to persons skilled in the art.

The invention claimed is:

1. An apparatus comprising an electromagnet, the electromagnet comprising:
   a yoke;
   a pair of mutually facing first and second pole pieces, wherein the yoke is not ferromagnetically separated from the first pole piece, the yoke is not ferromagnetically separated from the second pole piece;
   a first balancing member, at least a portion of which first balancing member is disposed radially outward of at least a portion of the first pole piece; and
   a first coil disposed radially outward of at least a portion of the first pole piece and in coaxial relation therewith, and wherein the first balancing member comprises at least one physical adaptation for at least partially counterbalancing an attractive force between the first coil and the yoke.

2. The apparatus of claim 1 further comprising a second balancing member, at least a portion of which second balancing member is disposed radially outward of at least a portion of the second pole piece; and
   a second coil disposed radially outward of at least a portion of the second pole piece and in coaxial relation therewith, and wherein the second balancing member comprises at least one physical adaptation for at least partially counterbalancing an attractive force between the second coil and the yoke.

3. The apparatus of claim 1 wherein the yoke comprises a first ferromagnetic material characterized by a first magnetic permeability and the first balancing member comprises a second ferromagnetic material characterized by a second magnetic permeability, wherein the second magnetic permeability is greater than the first magnetic permeability, the difference in magnetic permeability being the at least one physical adaptation.

4. The apparatus of claim 1 wherein the yoke comprises a first ferromagnetic material characterized by a first saturation magnetization and the first balancing member comprises a second ferromagnetic material characterized by a second saturation magnetization, wherein the second saturation magnetization is greater than the first saturation magnetization, the difference in saturation magnetization being the at least one physical adaptation.

5. The apparatus of claim 1, wherein the first pole piece comprises the first balancing member and is constructed from a plurality of constituent members, and wherein the first balancing member comprises at least two of the constituent members.

6. The apparatus of claim 5 wherein the constituent members of the first pole piece are configured as at least a first, a second, and a third ring, wherein the rings are disposed coaxially with respect to one another.

7. The apparatus of claim 6 wherein the yoke has a first arm and a second arm linked by a spine, wherein the first pole piece is physically coupled to the first arm, and wherein:
   (a) the first ring is at a first axial distance from the first arm and the second ring is at a second axial distance from the first arm that is further from the first arm than the first axial distance; and
   (b) a portion of the second ring is radially outward of the first ring, thereby defining a first recess, wherein the first recess at least partially counterbalances an attractive force between the first coil and the first arm.

8. The apparatus of claim 7 wherein an inner radius of the first coil is disposed radially outward of the second ring at the second axial distance.

9. The apparatus of claim 6 wherein the second and third ring comprise a material that is different than that of the first ring.

10. The apparatus of claim 7 wherein:
    (a) the third ring is at a third axial distance from the first arm that is further from the first arm than the second axial distance;
    (b) a portion of the third ring is radially outward of the second ring; and (c) a portion of third ring is radially outward of an inner radius of the first coil.

11. The apparatus of claim 7 wherein at least one of the constituent members of the first pole piece is characterized by:
one of a substantially square profile or a substantially rectangular profile in crosssection; and
at least one corner of the profile is chamfered.

12. The apparatus of claim 1 wherein the first pole piece is configured as a ring, wherein at least one field-tuning ring is disposed within the ring.

13. The apparatus of claim 1 wherein the first coil is situated closer to the first balancing member of the first pole piece than to the yoke.

14. The apparatus of claim 1 wherein first balancing member is separated by an air gap from other portions of the first pole piece and disposed in concentric relation thereto.

15. The apparatus of claim 14 wherein the first pole piece has a first diameter, the second pole piece has a second diameter, and the first diameter is larger than the second diameter.

16. The apparatus of claim 15 wherein when the apparatus is oriented such that an axis through the first pole piece and the second pole piece is vertical, the second pole piece is disposed above the first pole piece.

17. The apparatus of claim 1 wherein the apparatus is selected from the group consisting of an MRI machine, an NMR machine, and an ESR machine.

18. An apparatus comprising an electromagnet, the electromagnet comprising:
a yoke having first and second arms linked by a spine;
a pair of mutually facing first and second pole pieces, wherein the first pole piece is relatively closer to the first arm than to the second arm and the second pole piece is relatively closer to the second arm than to the first arm;
a first coil disposed around the first pole piece at a first axial position, the first coil having an inner radius; and
a first balancing member having an annular shape and an outer radius, the first balancing member disposed at a second axial position along the first pole piece, wherein the inner radius of the first coil is less than the outer radius of the first balancing member.

19. The apparatus of claim 18 wherein the second axial position is further from the first arm than the first axial position.

20. The apparatus of claim 18 wherein the first balancing member is disposed around the first pole piece in concentric relation and is spaced therefrom via an air gap.

21. The apparatus of claim 20 further comprising (i) a second balancing member having an annular shape and an outer radius and (ii) a second coil having an inner radius, wherein:
(a) the second coil is disposed around the second pole piece in concentric relation therewith at a third axial position;
(b) the second balancing member is disposed at a fourth axial position along the second pole piece, wherein the inner radius of the second coil is less than the outer radius of the second balancing member.

22. The apparatus of claim 18 wherein the first coil is disposed relatively closer to the first balancing member than to the first arm.

23. The apparatus of claim 18 wherein at least part of the first balancing member has a higher magnetic permeability than the yoke.

24. The apparatus of claim 18 wherein at least part of the first balancing member has a higher saturation magnetization than the yoke.

25. The apparatus of claim 18 wherein the first arm has a recess.

26. The apparatus of claim 18 wherein the first pole piece is configured as a ring, wherein at least one field-tuning ring is disposed within the ring.

27. The apparatus of claim 18 wherein the first pole piece has a larger diameter than the second pole piece.

28. The apparatus of claim 18 wherein the apparatus is selected from the group consisting of an MRI machine, an NMR machine, and an ESR machine.

29. An apparatus comprising an electromagnet, the electromagnet comprising:
a yoke having first and second arms linked by a spine;
a pair of mutually facing first and second pole pieces, wherein:
(a) the first pole piece is relatively closer to the first arm than to the second arm;
(b) the second pole piece is relatively closer to the second arm than to the first arm;
(c) an outer radius of each pole piece varies at a plurality of axial positions along the respective pole piece; and
a first coil disposed around the first pole piece at a first axial position, the first coil having an inner radius, wherein:
(a) the inner radius is less than an outer radius of the first pole piece at a second axial position;
(b) the second axial position is further from the first arm than the first axial position; and
(c) the first pole piece, at the second axial position, defines a portion of a first balancing member.

30. The apparatus of claim 29 wherein the yoke is not ferromagnetically separated from the first pole piece.

31. The apparatus of claim 29 wherein the first coil is situated closer to the first balancing member of the first pole piece than to the first arm.

32. The apparatus of claim 29 wherein at least part of the first balancing member has a higher magnetic permeability than the yoke.

33. The apparatus of claim 29 wherein at least part of the first balancing member has a higher saturation magnetization than the yoke.

34. The apparatus of claim 29, wherein the first pole piece is constructed from a plurality of constituent members, at least a portion of which compose the first balancing member.

35. The apparatus of claim 34 wherein some of the constituent members are comprises of different materials from one another.

36. The apparatus of claim 34 wherein at least some of the constituent members are annular in shape and have one of a square profile or a rectangular profile when viewed in axial cross-section.

37. The apparatus of claim 36 wherein one or more corners of the at least some constituent members having the square profile or the rectangular profile are chamfered.

38. The apparatus of claim 34 wherein at least some of the constituent members have a different height from other of the constituent members.

* * * * *